United States Patent
Balkenende et al.

(10) Patent No.: US 7,550,755 B2
(45) Date of Patent: Jun. 23, 2009

(54) SEMICONDUCTOR DEVICE WITH TUNABLE ENERGY BAND GAP

(75) Inventors: Abraham Rudolf Balkenende, Eindhoven (NL); Erik Petrus Antonius Maria Bakkers, Eindhoven (NL); Louis Felix Feiner, Eindhoven (NL)

(73) Assignee: Philips Lumiled Lighting Co., LLC, San Jose, CA (US)

( * ) Notice: Subject to any disclaimer, the term of this patent is extended or adjusted under 35 U.S.C. 154(b) by 308 days.

(21) Appl. No.: 11/577,808

(22) PCT Filed: Oct. 20, 2005

(86) PCT No.: PCT/IB2005/053444

§ 371 (c)(1),
(2), (4) Date: Apr. 24, 2007

(87) PCT Pub. No.: WO2006/046178

PCT Pub. Date: May 4, 2006

(65) Prior Publication Data

US 2009/0121209 A1      May 14, 2009

(30) Foreign Application Priority Data

Oct. 27, 2004    (EP) .................................. 04105316

(51) Int. Cl.
*H01L 29/00* (2006.01)
*H01L 29/02* (2006.01)
*H01L 29/06* (2006.01)

(52) U.S. Cl. .............................. 257/1; 257/13; 257/618; 257/E33.002; 257/E33.044; 257/E33.06; 257/E29.002

(58) Field of Classification Search .................... 257/1, 257/13, 618, E33.002, E33.044, E33.06, 257/E29.002
See application file for complete search history.

(56) References Cited

U.S. PATENT DOCUMENTS

| 3,676,795 | A  | 7/1972  | Pratt, Jr. |
| 4,935,935 | A  | 6/1990  | Reed et al. |
| 5,287,377 | A  | 2/1994  | Fukuzawa et al. |
| 5,615,224 | A  | 3/1997  | Cohen |
| 5,920,078 | A  | 7/1999  | Frey |
| 2003/0168964 | A1 | 9/2003  | Chen |
| 2003/0227015 | A1 | 12/2003 | Choi et al. |
| 2004/0012840 | A1 | 1/2004  | Takiguchi et al. |
| 2004/0027646 | A1 | 2/2004  | Miller et al. |
| 2004/0066677 | A1 | 4/2004  | Zhang et al. |

*Primary Examiner*—Evan Pert

(57) ABSTRACT

The present invention relates to a semiconductor device in which energy band gap can be reversibly varied. An idea of the present invention is to provide a device, which is based on a semiconducting material (306) in mechanical contact with a material that exhibits a reversible volume change when properly addressed, e.g. a phase change material (307). The device can, for example, be implemented in light emitting, switching and memory in applications. The semiconducting material can be reversibly strained by applying a local volume expansion to the phase change material. The resulting band gap variation of the semiconducting material can be utilized to tune the color of the light emitted from e.g. an LED or a laser. In other fields of application, contact resistance in semiconductor junctions can be controlled, and this feature is highly advantageous in memories and switches.

11 Claims, 3 Drawing Sheets

SEMICONDUCTOR DEVICE WITH TUNABLE ENERGY BAND GAP

The present invention relates to a semiconductor device in which energy band gap can be reversibly varied.

In a semiconducting material, band gap is an important parameter, which to a large extent determines properties of the semiconducting material. The band gap is defined as the difference in energy between the top of the valence band and the bottom of the conduction band. This is the energy that is required to excite an electron from the valence band into the conduction band. Electrons in the conduction band have the ability to move through the material, thereby enabling conduction of electricity. For light emitting diodes (LEDs), tuning of the band gap results in changes in color of emitted light. When an electron in the conduction band falls back into the valence band, the electron releases energy in the form of a photon of light. The larger the band gap, the more energetic the photon. A way to modify the band gap in a reversible manner is to strain the semiconductor lattice. It has been shown that band gap changes in the order of 100 meV may be accomplished. This change is sufficient for drastically changing the properties of e.g. a Schottky diode. In terms of light emission, this would result in a color change from e.g. yellow to green.

U.S. Pat. No. 4,935,935 discloses an electrically tunable semiconductor device. At least one film of piezoelectric substance is positioned in stress transmitting relation to the semiconductor device and a signal from an electrical circuit causes the piezoelectric to transmit stress to the semiconductor thereby varying the response of the semiconductor device. When a tuning voltage is applied to the piezoelectric film, the film deforms in proportion to the tuning voltage and applies stress to the semiconductor, which stress varies the semiconductor energy gap.

A problem that remains in U.S. Pat. No. 4,935,935 is that the effect of varying the semiconductor energy gap only remains as long as the tuning voltage is applied to the piezoelectric film.

An object of the present invention is to solve the above given problems and to provide a semiconductor device in which energy band gap may be varied. This object is attained by a semiconductor device in which energy band gap can be reversibly varied according to claim 1.

According to a first aspect of the present invention, there is provided a device comprising a semiconducting material and a phase change material arranged such that it presents a reversible change in volume, wherein the semiconducting material is arranged to be in mechanical contact with the phase change material, and the change in volume applies stress to said semiconducting material, which causes the energy band gap of the semiconducting material to vary.

An idea of the present invention is to provide a device, which is based on a semiconducting material in mechanical contact with a material that exhibits a reversible volume change when properly addressed, e.g. a phase change material. The device can, for example, be implemented in light emitting, switching and memory applications. The semiconducting material can be reversibly strained by applying a local volume expansion to the phase change material. The resulting band gap variation of the semiconducting material can be utilized to tune the color of the light emitted from e.g. a LED or a laser. This is a consequence of the fact that the band gap is proportional to the frequency of the emitted light. In other fields of application, contact resistance in semiconductor junctions can be controlled, and this feature is highly advantageous in memories and switches.

Volume expansion when going from crystalline phase to amorphous phase is in the order of 20% for common phase change materials. Similar to optical recording applications, the rate of heating and cooling and final temperature will determine local phase. Thermal treatment can be effected by means of a laser, but the semiconducting material can also be used to locally heat the phase change material by means of resistive heating.

The present invention is advantageous, since it enables tuning of the color of light emitted by a LED and further, switching of electrical devices by mechanical stimulus instead of electric stimulus. Hence problems including gate dielectrics and limited depletion width can be avoided, as is common in field effect transistors (FETs): Moreover, scalable memories can be obtained. Another major advantage in using a phase change material is that the induced band gap varying effect is bi-stable, as the material is either in the amorphous or in the crystalline state. This state remains until the phase change material is rewritten. This is particularly beneficial in memory applications.

According to an embodiment of the present invention, the semiconducting material comprises at least one semiconducting nanowire. This is advantageous, since for comparable strain conditions, i.e. for comparable volume expansions of the phase change material, the stress experienced by the semiconducting nanowire (and therefore the width of the energy band gap of the wire) will increase with smaller wire diameters. This implies that the use of nanowires is highly advantageous in these types of applications. Further, if the diameter of the wires is sufficiently small for quantum confinement effects to be observable, which typically implies a diameter below 10-20 nm, the band gap will increase due to the quantum confinement. These two band gap varying effects (i.e. band gap change induced by applied stress or by quantum confinement) enhance each other. For example, when compressive stress is applied, the band gap increases due to the applied stress, while in addition the band gap increases due to the increased quantum confinement effect because of the decrease of the diameter of the nanowire.

According to another embodiment of the present invention, the semiconducting material is embedded in the phase change material, which embedding further increases the stress caused by the phase change material when appropriate thermal conditions prevail. Ideally, the semiconducting material is completely embedded in the phase change material. Further embodiments of the invention are defined by the dependent claims.

Further features of, and advantages with, the present invention will become apparent when studying the appended claims and the following description. Those skilled in the art realize that different features of the present invention can be combined to create embodiments other than those described in the following.

Preferred embodiments of the present invention will be described in more detail with reference made to the accompanying drawings, in which.

Semiconducting wires and carbon nanotubes can be grown by employing a well-known vapor-liquid-solid (VLS) process. This process is typically performed in a temperature range from 400 to 800° C. The VLS process uses small metal particles as a nucleus for further growth. When employing sufficiently small metal particles, wire diameter can be made smaller than 10 nm. As an alternative approach, semiconducting wires and metals can be deposited in a suitable template by employing an electrochemical process at room temperature. In either process, or by combining the two processes, segmented wires consisting of, for example, n and p type semiconductor material or exhibiting a heterojunction can be grown. When a high density of semiconducting wires is required, a suitable template can be used. Electrochemical oxidation, i.e. anodization, of aluminum is known to result in highly regular porous alumina when proper conditions prevail. Typically, the pores are perpendicular to the surface of a substrate on which they are arranged. The pore diameter is highly uniform and can generally be varied from about 5 nm up to 300 nm. By local surface pre-treatment, such as by employing e-beams or imprinting, the pores can be laterally ordered. Alternative templates, like track-etched membranes, can be used instead of anodized alumina. Described is a method of fabrication based on catalytic growth from a suitable gas phase or electrochemical growth in a template, and embedding of a semiconducting material, preferably semiconducting nanowires, in a phase change material. For nanowires, any semiconducting type IV, III-V or II-VI material can be used.

Figure 1:
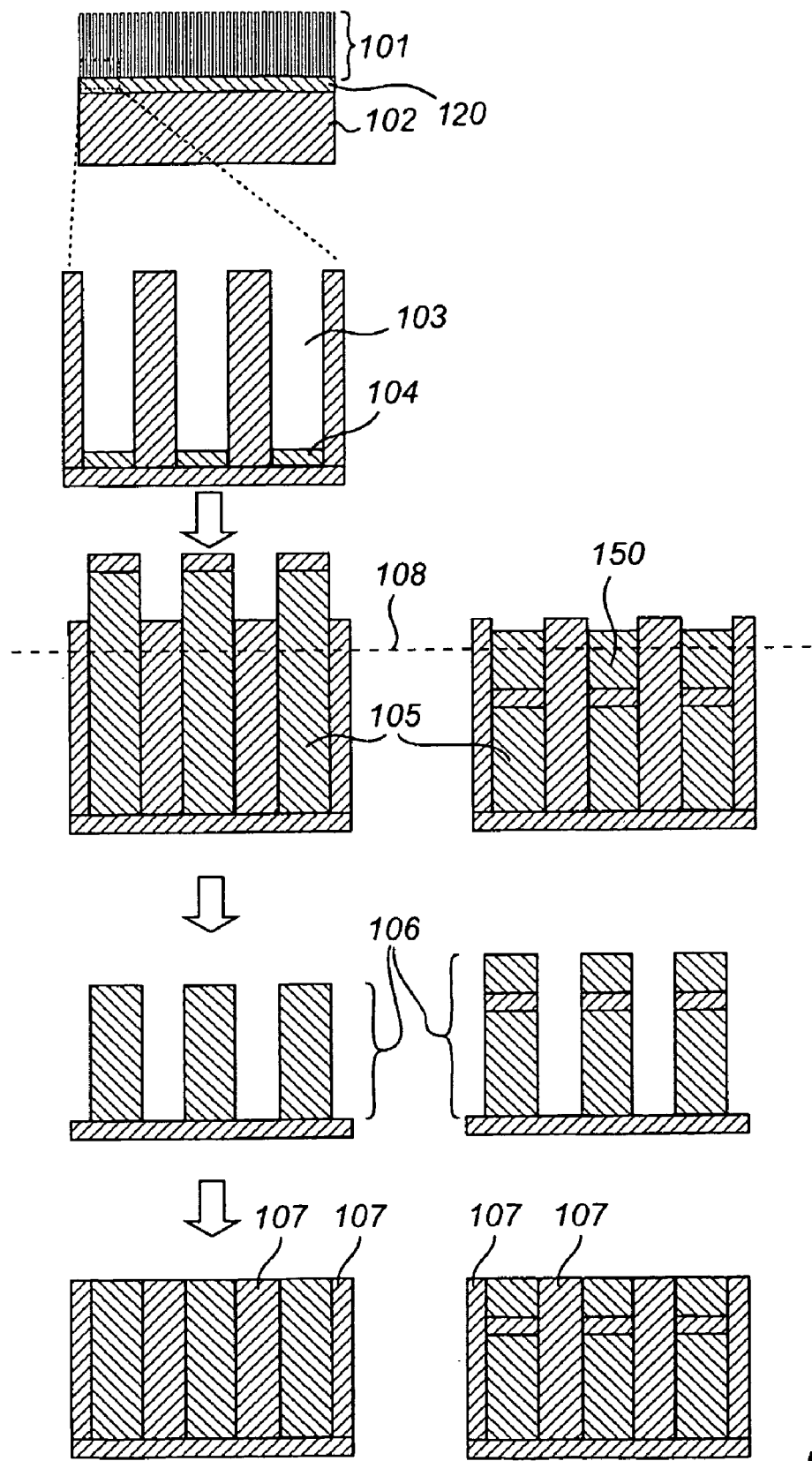
FIG. 1 shows an example of how nanowires can be grown, in which an anodized aluminum oxide template is arranged on a conductive layer of a substrate.

FIG. 1 shows an example of how nanowires can be grown. An anodized aluminum oxide template 101 is arranged on a conductive layer 120 of a substrate 102. The pores 103 of the template are partially filled with a metal deposition 104, such as Au, Fe, Co, Ni etc., as catalyst for VLS semiconductor wire growth. Standard VLS growth or electrochemical deposition may be employed to deposit a semiconducting material 105 such as CdSe, Si or InP. By changing the growth conditions during the wire growth, segmented wires 106 with e.g. pn-junctions or heterojunctions can be grown. Partially filled pores can further be filled (e.g. electrochemically) with a suitable contacting metal 150. Thereafter, the aluminum oxide (also known as alumina) is removed by etching the template in 1 M KOH, or by partly etching it in 4% $H_3PO_4$ or 1.5% $CrO_3$, such that at least the top section of the wires is no longer embedded in the alumina. Freestanding nanowires are hence created by means of the etching process. Subsequently, the top section is embedded in a phase-change material 107, e.g. $Ge_2Sb_2Te_5$, $Sb_{78}Te_{22}$, $Sb_{88}TeI_{12}$, AgInSbTe, $Ge_xIn_ySn_zSb_{1-x-y-z}$.

The layers created by the phase change material may be patterned such that individual wires or small groups of wires locally can be addressed. Before or after this embedding process, the top sections of the layers are polished, which is indicated by means of the dotted line 108, and electrical contacts (not shown) are deposited thereon. The nanowires may in an embodiment of the invention partially or completely be covered by a thin layer of dielectric.

When an Au pattern is directly deposited on Si (e.g. by patterning of a thin Au film using lithographic methods or by employing self-assembly methods to deposit colloidal Au particles), the VLS method can be used to locally grow wires at the position of the Au particles. Epitaxial growth of GaP, GaAs, IhP and InGaP on Si(100) and Si(111) has previously been described, while GaN epitaxially has been grown on various sapphire surfaces (e.g. Al2O3(001), Al2O3(2-10), Al2O3(100), Al2O3(101)). An epitaxial relation between the wire and the substrate is favorable with respect to wire orientation and (bottom) contact of the wire. This method results in free-standing wires at the substrate surface and further processing can be performed as described in other embodiments.

Figure 2:
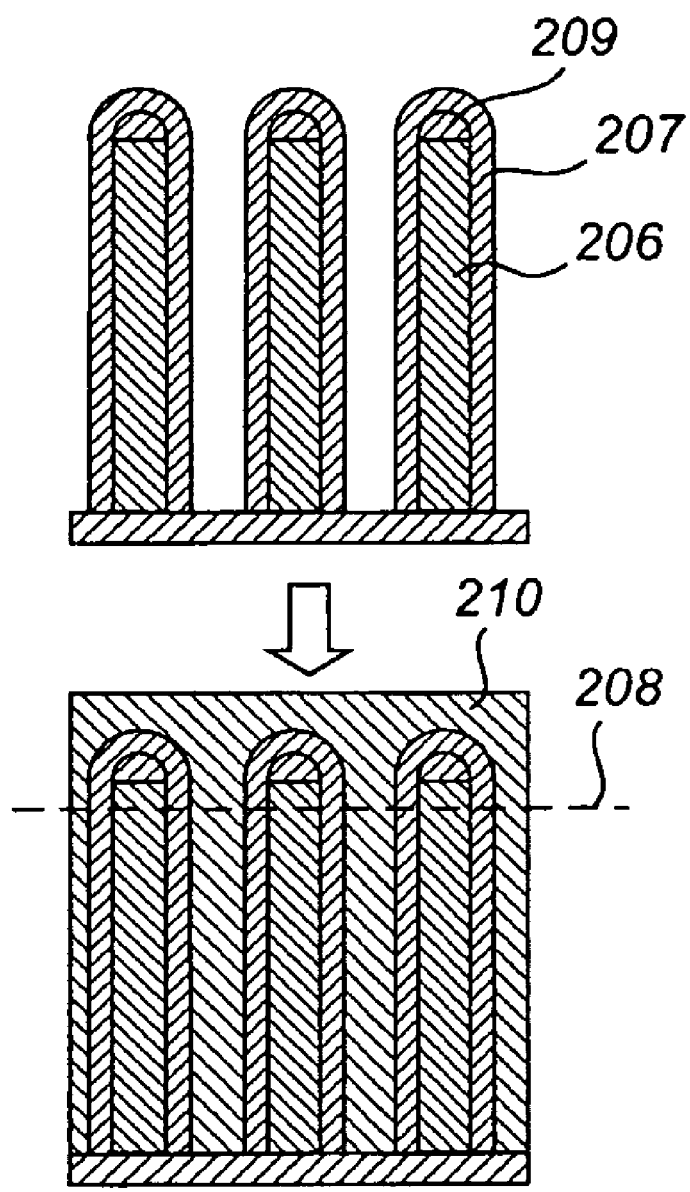
FIG. 2 shows an embodiment of the present invention, in which phase change electric material is deposited as a thin layer around the nanowires.

FIG. 2 shows an embodiment of the present invention, in which phase change material 207 is deposited as a thin layer around the nanowires 206. The nanowires are grown as described in connection to FIG. 1. In this particular embodiment, the nanowires are topped with metal 209. The wires are covered by a layer of phase change material with good step coverage, e.g. by means of chemical vapor deposition or sputter deposition in combination with sputter etching. The area between the wires is subsequently filled with a dielectric material 210. The top sections of the layers are polished, which is indicated by means of the dotted line 208, and electrical contacts (not shown) are deposited thereon.

Figure 3:
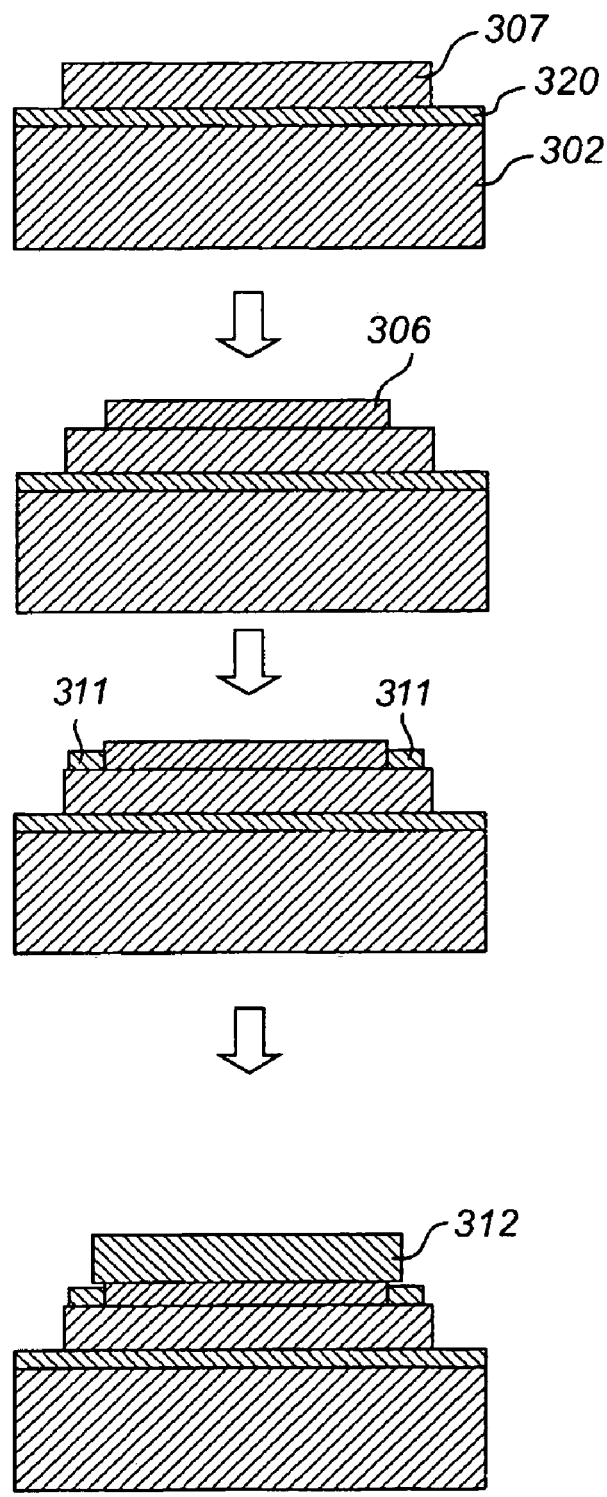
FIG. 3 shows another embodiment of the present invention, in which a semiconducting material and a phase change material is arranged on a conductive layer of a substrate.

FIG. 3 shows another embodiment of the present invention, in which a phase change material 307 is arranged on a conductive layer 320 of a substrate 302. Thereafter, an appropriate semiconducting material 306, e.g. a semiconducting nanowire as described hereinabove, is deposited thereupon, and electrical contacts in the form of metal source and drain electrodes 311 are applied to the semiconducting material 306. Subsequently, another layer of phase change material 312 may be deposited on the semiconducting material 306, such that the semiconducting material becomes embedded in the phase change material 307, 312. As a result of the second layer 312, the semiconducting material can be actuated "all-around" by the phase change material, which increases the effect of the applied strain. When the phase change material 312 is thermally treated by means of e.g. heating, it undergoes a reversible local volume expansion, and the semiconducting material 306 is reversibly exposed to stress. The resulting band gap variation of the semiconducting material 306 causes electrical properties of the semiconducting material to be varied.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A semiconductor device in which energy band gap can be reversibly varied, the device comprising:
   a semiconducting material (306);
   a phase change material (307) arranged such that it presents a reversible change in volume; wherein
   said semiconducting material is arranged to be in mechanical contact with said phase change material, and said change in volume applies stress to said semiconducting material, which causes the energy band gap of the semiconducting material to vary.

2. The semiconductor device in accordance with claim 1, wherein said semiconducting material is embedded in phase change material (307, 312).

3. The semiconductor device in accordance with claim 1, wherein a layer of dielectric is applied to the semiconducting material (306).

4. The semiconductor device in accordance with claim 1, wherein electrical contacts (311) are arranged at said semiconducting material (306).

5. The semiconductor device in accordance with claim 4, wherein the device comprises a number of semiconducting nanowires (306) being segmented.

6. The semiconductor device in accordance with claim 1, wherein said semiconducting material (306) comprises at least one semiconducting nanowire.

7. The semiconductor device in accordance with claim 6, wherein the semiconducting nanowires are arranged in juxtaposition and an area between the semiconducting nanowires is filled with a dielectric material (210).

8. The semiconductor device in accordance with claim 1, further comprising a substrate (302) having a conductive layer (320) on which said phase change material (307) is arranged.

9. The semiconductor device in accordance with claim 1, wherein the volume expansion of the phase change material is caused by thermal treatment by means of an external energy source.

10. The semiconductor device in accordance with claim 1, wherein the volume expansion of the phase change material is caused by thermal treatment by means of said semiconducting material.

11. The semiconductor device in accordance with claim 1, wherein said semiconducting material (306) is comprised in a light emitting diode, such that the varying energy band gap of the semiconducting material varies the color of light emitted from said light emitting diode.

* * * * *